United States Patent [19]

Kinion

[11] Patent Number: 5,602,719
[45] Date of Patent: Feb. 11, 1997

[54] NO HANDLE ZIP SOCKET

[75] Inventor: Michael Kinion, Hillsboro, Oreg.

[73] Assignee: Intel Corporation, Santa Clara, Calif.

[21] Appl. No.: 558,032

[22] Filed: Nov. 13, 1995

[51] Int. Cl.[6] .................................................. H05K 7/20
[52] U.S. Cl. ........................... 361/704; 24/625; 165/80.2; 165/185; 248/505; 257/719; 361/710; 411/530; 439/73
[58] Field of Search ............................. 24/464, 466, 473, 24/625; 165/80.2, 80.3, 121, 122, 185; 174/16.3; 248/316.7, 505, 510; 257/706–707, 712–713, 718–719, 726–727; 361/690, 694–697, 704, 707, 709–711, 714–715, 719, 722; 411/352, 530; 439/71–74, 341, 485, 487

[56] References Cited

U.S. PATENT DOCUMENTS

| | | | |
|---|---|---|---|
| 4,130,327 | 12/1978 | Spaulding | 439/71 |
| 4,433,886 | 2/1984 | Cassarly et al. | 439/71 |
| 5,000,689 | 3/1991 | Ishizuka et al. | 439/73 |
| 5,371,652 | 12/1994 | Clemens et al. | 174/16.3 |
| 5,486,981 | 1/1996 | Blomquist | 174/16.3 |

Primary Examiner—Gregory D. Thompson
Attorney, Agent, or Firm—Blakely, Sokoloff, Taylor & Zafman

[57] ABSTRACT

An electronic package assembly that has a clip which attaches a heat sink to an electronic package and can be rotated to separate the package from a socket. The assembly includes a socket that is mounted to a printed circuit board and attached to a lower frame. The electronic package is attached to an upper frame that is pivotally connected to the lower frame. The package can be plugged and unplugged from the socket by rotating the upper frame relative to the lower frame. The clip has a first end with an aperture that is connected to a corresponding tab of the lower frame, and a second opposite end that has an aperture which is connected to a corresponding tab of the upper frame. The clip has a spring portion that extends across the heat sink and which presses the heat sink onto the package. The second clip end has a handle portion which allows the end user to pull the clip and rotate the upper frame away from the lower frame to detach the package from the socket.

10 Claims, 2 Drawing Sheets

FIG. 1 PRIOR ART
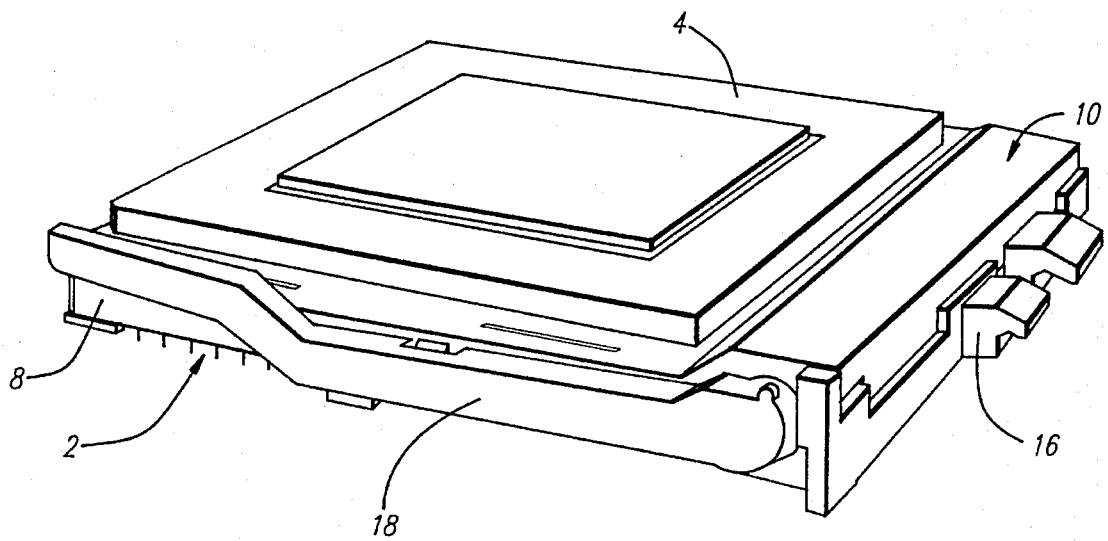
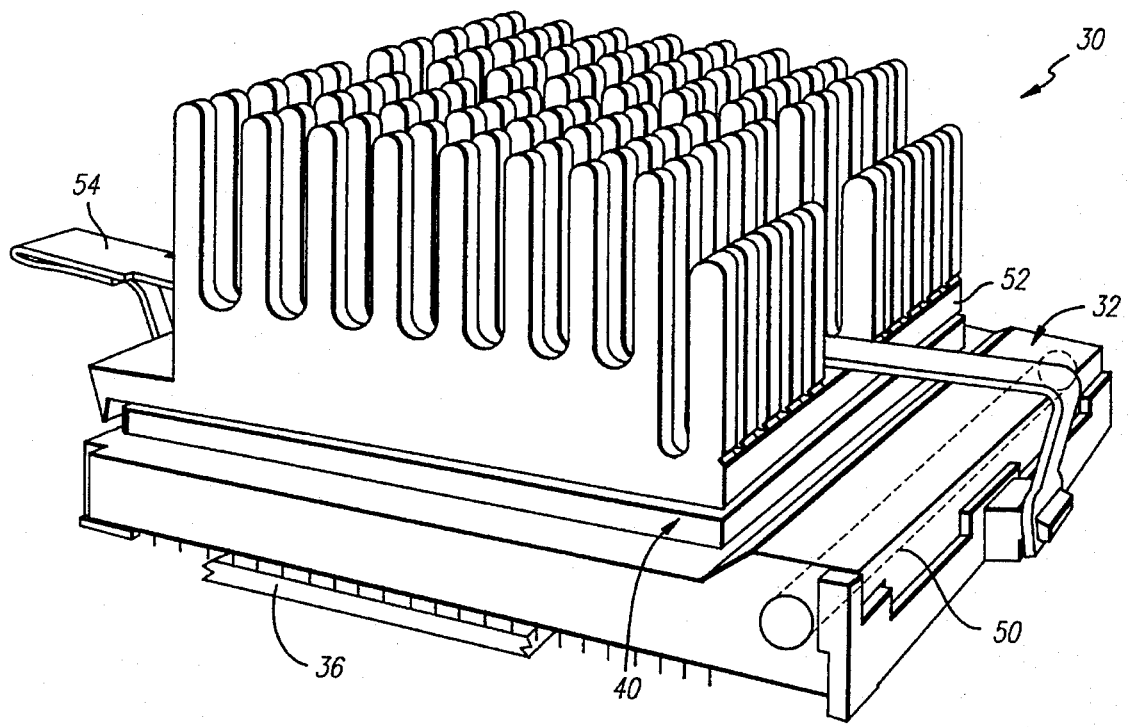
FIG. 3

NO HANDLE ZIP SOCKET

BACKGROUND OF THE INVENTION

1. Field of the Invention

The present invention relates to an electronic package assembly.

2. Description of Related Art

Electronic assemblies typically contain a plurality of electronic packages that are coupled to a printed circuit board. Some of the packages are plugged into sockets that are mounted to the board. The sockets allow the end user to easily attach and remove the package from the board.

FIG. 1 shows a prior art electronic package assembly that utilizes a socket 2 to couple an electronic package 4 to a printed circuit board [not shown]. The socket 2 is connected to a lower frame 8. The package 4 is attached to an upper frame 10 that is pivotally connected to the lower frame 8. The assembly also includes a heat sink [not shown] that is pressed onto the electronic package 4 by a clip [not shown]. The clip [not shown] is attached to each end of the lower frame 10 by a pair of frame tabs 16 that extend into corresponding slots of the clip.

Electronic packages that have a large number of pins require a relatively high ejector force to separate the package from the socket. To facilitate separation of the package 4 from the socket 2, the electronic package assembly has a cam lever 18 that can be rotated to push the upper frame 10 away from the lower frame 8 and unplug the package 4.

It is generally desirable to optimize an electronic assembly by providing a maximum number of packages in a minimum amount of space. The lever of the electronic package assembly of the prior art extends from the side of the frame and thus occupies valuable board space. Additionally, it has been found that the cam lever is difficult to operate when other packages are located immediately adjacent to the lever. Therefore it would be desirable to provide an electronic package/socket assembly that can unplug the package from the socket without a lever or other mechanism that requires additional board space.

SUMMARY OF THE INVENTION

The present invention is an electronic package assembly that has a clip which attaches a heat sink to an electronic package and can be rotated to separate the package from a socket. The assembly includes a socket that is mounted to a printed circuit board and attached to a lower frame. The electronic package is attached to an upper frame that is pivotally connected to the lower frame. The package can be plugged and unplugged from the socket by rotating the upper frame relative to the lower frame. The clip has a first end with an aperture that is connected to a corresponding tab of the lower frame, and a second opposite end that has an aperture which is connected to a corresponding tab of the upper frame. The clip has a spring portion that extends across the heat sink and which presses the heat sink onto the package. The second clip end has a handle portion which allows the end user to pull the clip and rotate the upper frame away from the lower frame to detach the package from the socket.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a perspective view of an electronic package assembly of the prior art;

FIG. 3 is a perspective view of the electronic package assembly.

DETAILED DESCRIPTION OF THE INVENTION

Figure 2:
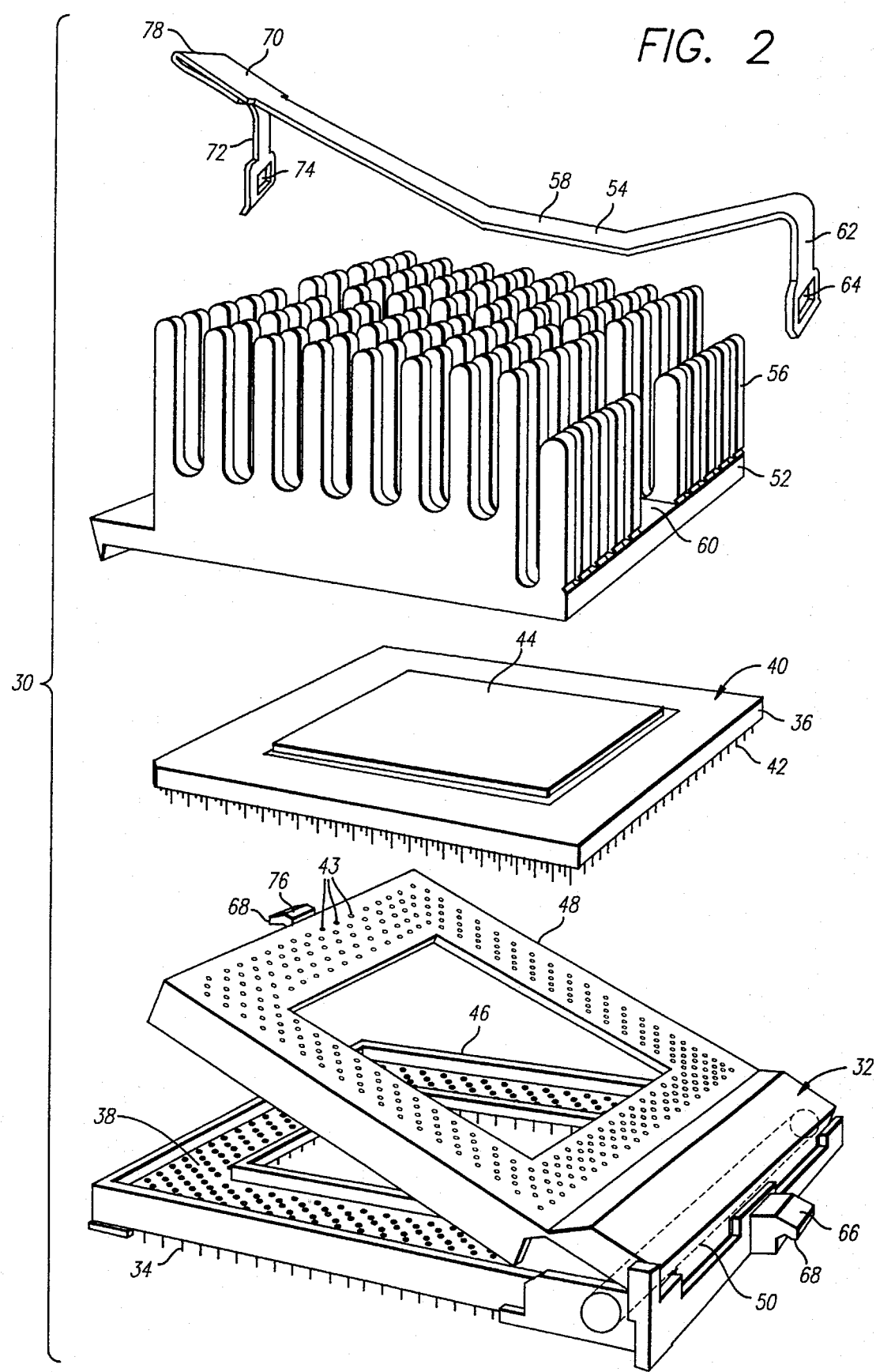
FIG. 2 is an exploded view of an electronic package assembly of the present invention.

Referring to the drawings more particularly by reference numbers, FIGS. 2 and 3 show an electronic package assembly 30 of the present invention. The assembly 30 includes a socket 32 which has a plurality of pins 34 that are typically soldered to corresponding contacts of a printed circuit board 36. The pins 34 are connected to a plurality of individual sockets 38 which have openings located in the top surface of the socket assembly 32. The socket 32 is typically constructed from a molded plastic, or co-fired ceramic material, which has a coefficient of thermal expansion that corresponds to the coefficient of thermal expansion of the board 36.

The assembly 30 further contains an electronic package 40 which has a plurality of pins 42 that can be plugged into the individual sockets 38 of the socket assembly 32. The package 40 typically houses an integrated circuit (not shown) such as a microprocessor. The pins 42 and corresponding sockets 38 electrically couple the integrated circuit to the board 36. The electronic package 40 may further have a heat slug 44 extending from the top surface of the package 40.

The socket 32 is attached to a lower frame 46. The package 40 is attached to an upper frame 48 that is pivotally connected to the lower frame 46. The upper frame 48 typically has a pair of integrally formed, oppositely located pins 50 that extend into corresponding apertures of the lower frame 46 to allow relative rotational movement between the two frame members. The frames have center openings 43 that allow the pins 42 of the package 40 to be plugged into the sockets 38 when the upper frame 48 is rotated toward the lower frame 46.

To improve the thermal efficiency of the package 40, the assembly further contains a heat sink 52 that is pressed onto the heat slug 44 by a clip 54 that is connected to the lower 46 and upper 48 frame members. The heat sink 52 has a plurality of fins 56 that maximize the heat transfer rate from the sink 52. The clip 54 has a spring portion 58 that extends across a slot 60 located between the fins 56. The spring portion 58 is preferably a bent segment of the clip 54 that deflects when the clip 54 is attached to the upper 48 and lower 46 frames. The clip 54 is preferably constructed from a metal material that will provide an adequate spring force to press the heat sink 52 into the package 40. A thermal grease may be applied to the top surface of the heat slug 44 to improve the heat transfer rate between the package 40 and the heat sink 52.

The clip 54 includes a first end 62 which contains a first aperture 64. The first aperture 64 a corresponding tab 66 that extends from the lower frame 46. The tab 66 may have a lip 68 that captures the first end 62 of the clip 54. Opposite from the first end 62 is a second end 70 that has an arm 72. The arm 72 has a second aperture 74 that receives a corresponding tab 76 of the upper frame 48. The tab 76 may also have lip 68 that capture the clip 54. The clip 54 can be detached from the frames 46 and 48, by deflecting and pushing the tabs 66 and 76 through the apertures 64 and 74.

The second end 70 has a handle portion 78 that can be pulled by the end user to rotate the upper frame 48 from the lower frame 46. Rotation of the upper frame 48 separates the pins 42 from the sockets 38 and decouples the package 40 from the socket assembly 32 and the board 36. The handle portion 78 can also be used to plug the package 40 into the socket 32. The clip 54 of the present invention thus provides the dual functions of attaching the heat sink 52 to the package 40, and providing a mechanism that allows the user to plug and separate the package 40 from the socket 32. Locating the clip 54 along the top surface of the heat sink 52 does not require additional board space to implement the cam device thus minimizing the profile of the assembly.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package asssembly, comprising;

a lower frame;

an upper frame pivotally connected to said lower frame;

a socket that is attached to said lower frame;

an electronic package that is attached to said upper frame and is coupled to said socket;

a heat sink that is located adjacent to said electronic package; and, a clip that has a first end connected to said lower frame and a second opposite end connected to said upper frame, said clip extends across said heat sink to press said heat sink onto said electronic package, said second end of said heat sink has a handle portion that can be pulled to rotate said upper frame relative to said lower and decouple said electronic package from said socket.

2. The assembly as recited in claim 1, wherein said first end has an aperture that receives a corresponding tab of said lower frame to connect said first end to said lower frame.

3. The assembly as recited in claim 1, wherein said second end has an aperture that receives a corresponding tab of said upper frame to connect said second end to said upper frame.

4. The assembly as recited in claim 2, wherein said second end has an aperture that receives a corresponding tab of said upper frame to connect said second end to said upper frame.

5. The assembly as recited in claim 1, wherein said clip has a spring portion that presses said heat sink into said electronic package.

6. An electronic package assembly, comprising:

a printed circuit board;

a lower frame;

an upper frame pivotally connected to said lower frame;

a socket that is attached to said lower frame and mounted to said printed circuit board;

an electronic package that is attached to said upper frame and is coupled to said socket;

a heat sink that is located adjacent to said electronic package; and, a clip that has a first end connected to said lower frame and a second opposite end connected to said upper frame, said clip extends across said heat sink to press said heat sink onto said electronic package, said second end of said heat sink has a handle portion that can be pulled to rotate said upper frame relative to said lower frame and decouple said electronic package from said socket.

7. The assembly as recited in claim 6, wherein said first end has an aperture that receives a corresponding tab of said lower frame to connect said first end to said lower frame.

8. The assembly as recited in claim 6, wherein said second end has an aperture that receives a corresponding tab of said upper frame to connect said second end to said upper frame.

9. The assembly as recited in claim 7, wherein said second end has an aperture that receives a corresponding tab of said upper frame to connect said second end to said upper frame.

10. The assembly as recited in claim 6, wherein said clip has a spring portion that presses said heat sink into said electronic package.

* * * * *

UNITED STATES PATENT AND TRADEMARK OFFICE
CERTIFICATE OF CORRECTION

PATENT NO.    : 5,602,719
DATED         : February 11, 1997
INVENTOR(S)   : Michael Kinion It is certified that error appears in the above-identified patent and that said Letters Patent is hereby corrected as shown below:

In the Title Page at [54] delete "ZIP" and insert --ZIF--

In column 3 at line 22 delete "asssembly," and insert --assembly,--

In column 3 at line 36 insert --frame-- following "lower"

Signed and Sealed this

Twentieth Day of May, 1997

Attest:

BRUCE LEHMAN

Attesting Officer          Commissioner of Patents and Trademarks